(12) United States Patent  
Niles et al.

(10) Patent No.: US 8,133,760 B2
(45) Date of Patent: Mar. 13, 2012

(54) SYSTEM AND METHOD FOR BACKSIDE CIRCUIT EDITING ON FULL THICKNESS SILICON DEVICE

(75) Inventors: David Winslow Niles, Fort Collins, CO (US); Ronald William Kee, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 434 days.

(21) Appl. No.: 12/470,680

(22) Filed: May 22, 2009

(65) Prior Publication Data

US 2010/0297787 A1 Nov. 25, 2010

(51) Int. Cl.
*H01L 21/00* (2006.01)
(52) U.S. Cl. .................... 438/107; 257/E21.503
(58) Field of Classification Search .................. 438/107, 438/108; 257/E21.503, E21.511, E27.136, 257/E27.143
See application file for complete search history.

(56) References Cited

U.S. PATENT DOCUMENTS

| | | | |
|---|---|---|---|
| 6,855,622 B2 | 2/2005 | Le Roy et al. | |
| 6,955,930 B2 | 10/2005 | Le Roy et al. | |
| 7,115,426 B2 | 10/2006 | Le Roy et al. | |
| 7,439,168 B2 | 10/2008 | Boit et al. | |
| 2007/0087572 A1 | 4/2007 | Le Roy et al. | |

*Primary Examiner* — Bradley K Smith
*Assistant Examiner* — Amar Movva

(57) ABSTRACT

A system for accessing circuitry on a flip chip circuit device with active circuitry and full-thickness bulk silicon includes a moveable surface for supporting and locating the circuit device in a plane, an infrared (IR) imaging device located at a defined perpendicular distance from a surface of the bulk silicon, the surface of the bulk silicon parallel to the plane and a milling chamber configured to direct an etchant and a focused ion beam to the surface of the bulk silicon, resulting in a gas-enhanced milling process that creates a milled cavity in the bulk silicon. The system produces an IR reflective material located at a base of the cavity, wherein the circuit device is located within a field of view of the IR imaging device such that the IR reflective material is brought into focus by moving the IR imaging device an adjustable distance perpendicular to the surface of the bulk silicon, and where the adjustable perpendicular distance is indicative of a depth of the cavity.

17 Claims, 7 Drawing Sheets

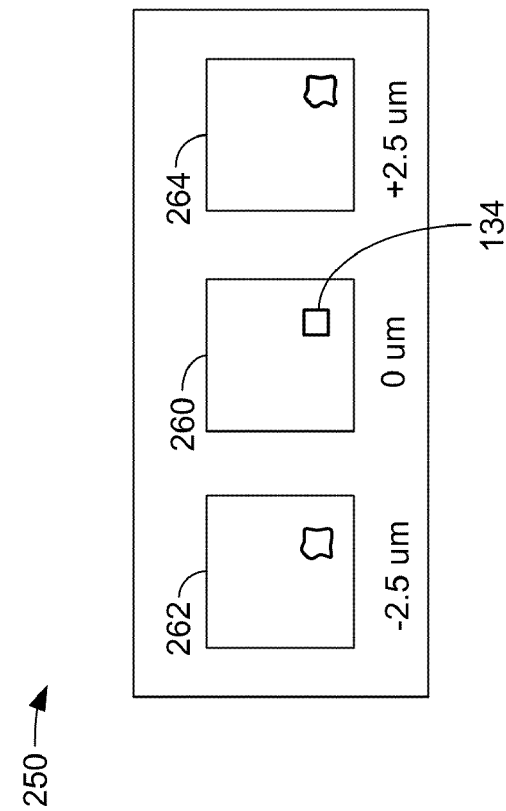
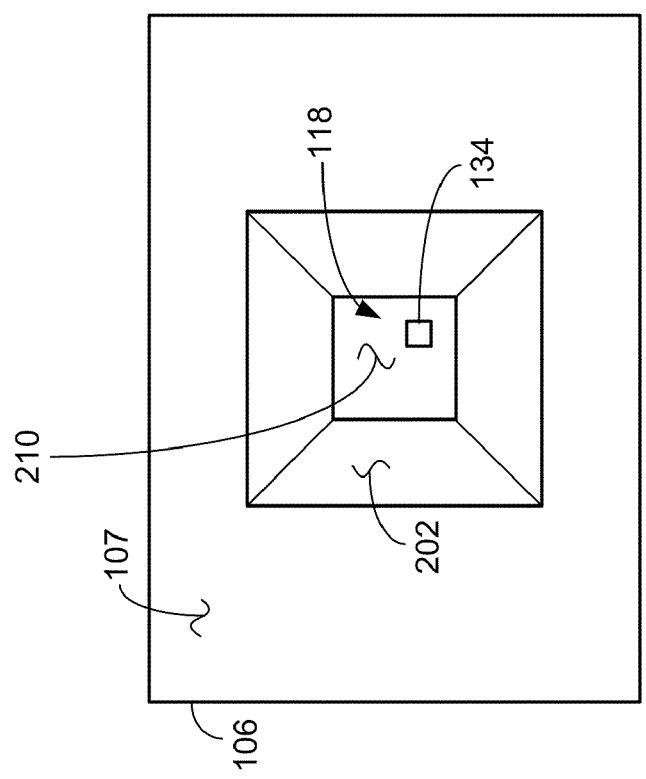
FIG. 2A
FIG. 2B

SYSTEM AND METHOD FOR BACKSIDE CIRCUIT EDITING ON FULL THICKNESS SILICON DEVICE

BACKGROUND

One of the packaging techniques for an integrated circuit (IC) device is referred to as a "flip-chip" package. A flip chip package, also referred to as controlled collapse chip connection (C4), is a method for interconnecting semiconductor devices, such as an IC chip and a micro electromechanical system (MEMS), to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect.

SLC (surface laminar circuit) is a technology that applies thin film processes that effectively provide for the formation of fine lines and interconnections and microvias to a circuit board core to produce the wiring density called for by flip-chip mounting technologies. Because the circuitry is effectively facing downward, once a circuit design is fabricated onto a flip-chip style package, any changes to the circuit become problematic.

When it is desirable to effect a circuit change to a fabricated device, a technique referred to as "backside circuit editing" is performed to access the active portions of a circuit from the rear, or backside of the device package.

A known technique for backside circuit editing uses a focused ion beam (FIB) to access the circuitry after the part has been mechanically thinned. In an embodiment, a typical FIB uses a liquid metal ion source (LMIS) to produce a beam of Ga+ ions that is focused by a column of electron optics onto a sample surface. The optical column shapes the beam in magnitude (e.g., several picoamperes (pA) to many nanoamperes (nA)), voltage (e.g., tens of kilovolts (kV)), and size (e.g., several nanometers (nm) to several micrometers ($\mu$m)), and rasters the beam over an area (ranging from approximately one square micrometer ($\mu m^2$) to approximately one square millimeter ($mm^2$) to produce an image of the surface. In a typical application, the thickness of the bulk silicon substrate is approximately 770 $\mu$m. Typically, a protective lid and capacitors are removed from the device. Then, the bulk of the silicon is mechanically removed by applying a polishing medium to the silicon, and removing as much of the silicon as possible, without damaging the circuitry or the device. The final thickness of the bulk silicon after thinning is typically 100 $\mu$m but can be thicker or thinner if warranted. Unfortunately, such mechanical polishing often leads to the formation of cracks in the silicon that damage or destroy the circuit device.

While mechanical thinning of the device has enabled the development of effective backside circuit editing techniques, it has drawbacks, such as cracking, thermal consequences leading to poor heat dissipation, etc. These drawbacks compromise the performance of the device. Furthermore, the removal of the capacitors, which is necessary to thin the bulk silicon, also can lead to detrimental effects, such as performance changes, jitter, etc.

Several methods for milling small access holes through the approximately 770 $\mu$m thickness of the bulk silicon have been studied, but have failed to be useful due to an inability to determine the milling rate and depth of the access hole or cavity. Full-thickness backside circuit editing has not been brought to fruition because the milling rate and depth of the milled cavity used to access the circuitry can not be measured accurately.

Therefore, it would be desirable to have a way to access the desired circuitry for editing purposes, without the need for thinning the entire backside of the flip chip.

SUMMARY

In an embodiment, a system for accessing circuitry on a silicon device comprises a flip chip circuit device comprising active circuitry and full-thickness bulk silicon, a moveable surface for supporting and locating the circuit device in a plane, an infrared (IR) imaging device located at a defined perpendicular distance from a surface of the bulk silicon, the surface of the bulk silicon parallel to the plane and a milling chamber configured to direct an etchant and a focused ion beam to the surface of the bulk silicon, resulting in a gas-enhanced milling process that creates a milled cavity in the bulk silicon. The system also includes an IR reflective material located at a base of the cavity, wherein the circuit device is located within a field of view of the IR imaging device such that the IR reflective material is brought into focus by moving the IR imaging device an adjustable distance perpendicular to the surface of the bulk silicon, and where the adjustable perpendicular distance is indicative of a depth of the cavity.

Other embodiments are also provided. Other systems, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 2A is a plan view illustrating a portion of the surface of the bulk silicon of FIG. 1C.

FIG. 2B is a graphical depiction showing three instances of the IR reflective tag of FIG. 2A.

DETAILED DESCRIPTION

Embodiments of the system and method for backside circuit editing on full thickness silicon devices are implemented in an integrated circuit architecture that employs a "flip chip" architecture in which it is desirable to access portions of the active circuitry through the bulk silicon, while eliminating any mechanical thinning or polishing of the entire circuit device.

Figure 1A:
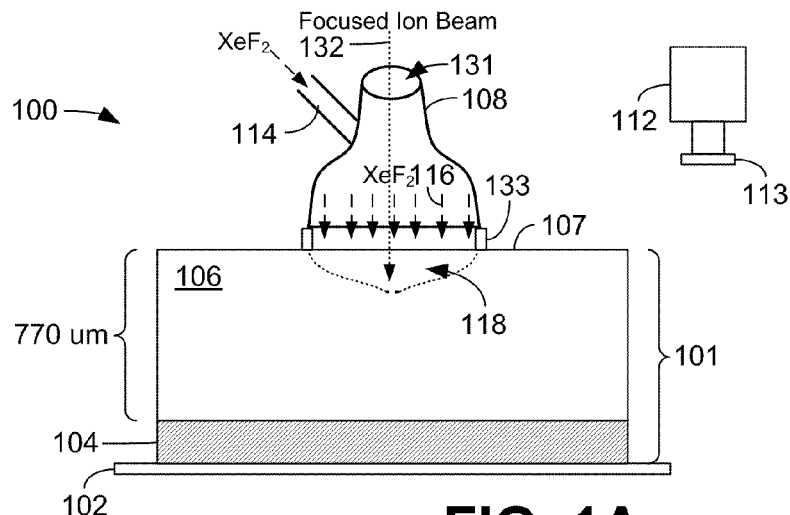
FIGS. 1A through 1C are schematic diagrams illustrating a portion of a system for backside circuit editing on full thickness silicon devices.

FIG. 1A is a schematic diagram illustrating a portion 100 of a system for backside circuit editing on full thickness silicon devices. The portion 100 includes a circuit device 101 that is to be edited. The circuit device 101 includes active circuit portion 104 and bulk silicon 106. In an embodiment, the bulk silicon 106 is approximately 770 μm thick. The active circuit portion 104 may include one or more specific areas where it is desirable to access the active circuitry and perform circuit editing without removing the entire bulk silicon 106. The circuit device 101 is located on a movable surface 102. In an embodiment, the movable surface 102 can be part of a table, or other type of platform, the location of which can be precisely controlled, typically in the X and Y directions.

The system portion 100 also includes a milling chamber 108. The milling chamber 108 is positioned above the surface 107 of the bulk silicon 106 so that an etchant material, typically a reactive gas, can be contained and directed to specific areas of the surface 107 of the bulk silicon 106, while a focused ion beam (FIB) mechanically erodes the surface 107 simultaneously with the etchant material. The milling chamber 108 is sometimes referred to as a "bee hive" due to its overall shape and appearance. The milling chamber 108 includes a support structure 114, which can be fabricated as a hollow tube through which an etchant can be directed into the interior portion of the milling chamber 108. The milling chamber 108 also includes an opening 131, which allows a focused ion beam 132 to image and to mechanically erode the bulk silicon 106. Simultaneously applying the focused ion beam 132 and the chemical etchant realizes a mode commonly called gas-enhanced milling since it combines mechanical milling and chemical etching that erodes the silicon as much as ten times faster than either milling or etching alone.

In an embodiment, the etchant can be a gas, such as, for example, xenon difluoride ($XeF_2$), dibromide ($Br_2$), dichloride ($Cl_2$), or another suitable etchant as known in the art, and the focused ion beam can be a $Ga^+$ beam from a liquid metal ion source (LMIS). In an embodiment, the focused ion beam can have a current of approximately 4.4 nanoamperes (nA) and a physical size of approximately 0.3 micrometers (μm) at the focus. The focused ion beam can raster across the surface 107 in a pattern to encompass an area of approximately 5000 μm². The focused ion beam can dwell at a given point for approximately 0.5 μs, can step approximately 0.5 μm to the next dwell point, and can then repeat.

The system portion 100 also includes an infrared (IR) imaging device 112. In an embodiment, the IR imaging device 112 can be an IR camera equipped with an IR objective lens 113 having a numerical aperture (NA) of 0.80 and fixed focal length of 3 mm. However, other numerical apertures and focal lengths are possible. The IR camera 112 is located above the surface 107 and controllably supported so that the IR objective lens 113 is located at a known distance, d, above the surface 107. In an embodiment, the distance d can be 3 mm. The IR camera 112 is located so that portions of the bulk silicon 106 can be brought into the field of view of the IR camera by controlling the location of the moveable surface 102. In an alternative embodiment, the IR objective lens 113 can be flexibly coupled to the IR camera 112, where the IR camera 112 may remain stationary and the objective lens 113 is movable in the Z direction.

In an embodiment, the milling chamber 108 is brought into gentle contact with and sealed to the surface 107 using a flexible seal 133, as known to those skilled in the art. The flexible seal 133 prevents the etchant material from escaping the surface 107. A supply of gaseous etchant (i.e., $XeF_2$) is supplied through the support structure 114, directing the etchant against the surface 107, as depicted by arrows 116 within the etching chamber 108. The milling chamber 108 directs the flow of the $XeF_2$ onto the surface 107 while the focused ion beam mechanically erodes the surface, resulting in a trench or cavity 118 being formed (i.e., milled) into the bulk silicon 106 in accordance with the gas-enhanced milling process described above. In accordance with an embodiment of the system and method for backside circuit editing on full thickness silicon devices, the gas-enhanced milling process is applied to the surface 107 for a predetermined period of time, the duration of which is designed to be well less than the time it would take to completely mill through the bulk silicon 106 to the active circuit 104. In an embodiment, the gas-enhanced milling process is applied for approximately one hour with the focused ion beam current at approximately 4.4 nA, the raster pattern at approximately 70 μm by 70 μm, and the etchant pressure at approximately 1.3 Torr. However, this predetermined time is dependent upon the thickness of the bulk silicon 106, the etchant material, the flow of the etchant material, the current in the focused ion beam, the details of the rastering pattern, the shape and efficiency of the milling chamber 108, and other factors.

Figure 1B:
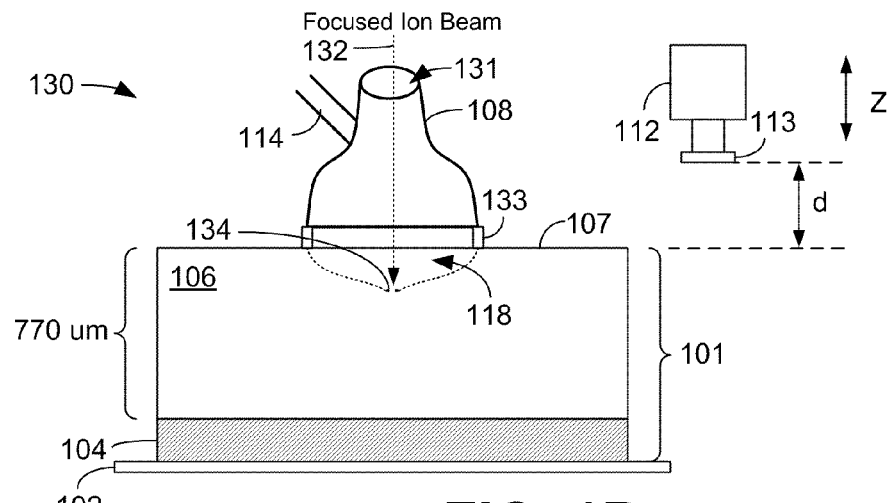

FIG. 1B is a schematic diagram illustrating a portion 130 of a system for backside circuit editing on full thickness silicon devices. As shown in FIG. 1B, the gas-enhanced milling mode is terminated by terminating both the supply of etchant through the support structure 114 and the focused ion beam 132. The milling chamber 108 is moved upwards to disengage the circuit device 101. Thereafter, a focused ion beam 132 of a material that is reflective of IR energy is supplied through the opening 131 of the etching chamber 108 and is directed toward the bottom of the cavity 118 within the rastering pattern defined during the gas-enhanced milling process. The material that is reflective of IR energy forms what is referred to as a "tag" 134 at the bottom of the cavity 118. When viewed with the IR camera 112, the IR reflective tag 134 presents as a bright spot in the IR image since it reflects more IR light than the surrounding silicon of the cavity. In an embodiment, the focused ion beam 132 is the same focused beam of gallium (Ga) used during the gas-enhanced milling mode, but supplied without the etchant 116 and for a short time so as to deposit a layer of gallium without significant mechanical erosion of the silicon in the cavity 118. The gallium is provided at a dose of approximately 0.1 nanoCoulomb/μm² (hereafter, nC/μm²) at approximately 50 kilovolts (kV) to form the IR reflective tag 134 whereby the gallium forms a region of metal-silicide at the bottom of the cavity 118.

As an example, a small etching pattern, typically on the order of 5 μm×5 μm, is created on the bottom of the cavity 118 by activating the focused ion beam of gallium for approximately 0.1 nC/μm² (2 to 3 seconds) to form a metal-silicide that forms the IR reflective tag 134. The exact dose and size of the IR reflective tag 134 can vary, depending on application, and the material may be any material that forms a conductive silicide with the bulk silicon. Any electrically conductive layer, which can be a silicide in the embodiments described herein, will reflect more IR light than the surrounding, non-conductive silicon. In an embodiment, the same ion beam used for the gas-enhanced milling mode is readily available, and the usable ion dose for the IR reflective tag 134 may vary from approximately 0.02 nC/μm² to approximately 0.5 nC/μm². Larger doses may create what are referred to as "leader" holes on the floor of the cavity, and smaller doses may be insufficient to form a clearly visible IR reflective tag. Leader holes are paths that can open to the active circuit 104 before the remainder of the gas-enhanced mill is complete.

Figure 1C:
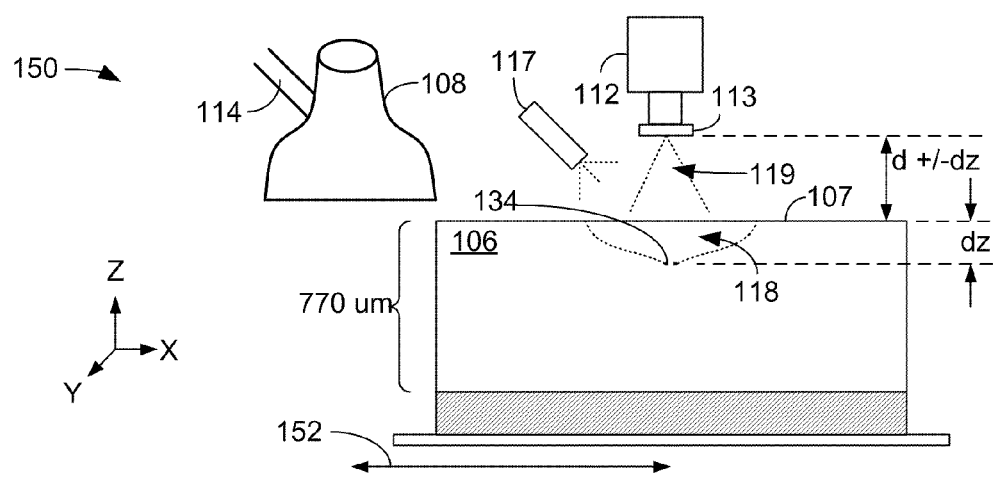

As shown in FIG. 1C, the circuit device 101 is moved in at least one of the X and Y directions by the movable surface 102, as shown using reference numeral 152, so that the objective lens 113 of the IR camera 112 is positioned directly above the bottom of the cavity 118 such that the IR reflective tag 134 falls within the field of view 119 of the objective lens 113. The IR reflective tag 134 reflects the infrared radiation provided by an external incandescent light source 117 back to the objective lens 113 of the IR camera 112 so that the objective lens 113 can focus on the IR reflective tag 134. As mentioned above, the objective lens 113 of the IR camera 112 has a fixed focal length. In an embodiment, an objective lens 113 can have a magnification of 100×, a numerical aperture (NA) of approximately 0.80 and a focal length of approximately 3 mm. The objective lens 113 moves up and down in the Z direction until the surface, or floor, of the cavity 118, as monitored by the appearance of the IR reflective tag 134, is brought to the focal position of the objective lens 113. The depth, dz, of the cavity is then determined by comparing the Z height of the IR objective lens 113 when it focused on the original surface 107 before milling to the Z height of the IR objective lens 113 when focused on the IR reflective tag 134 at the bottom of the cavity 118. Because the distance, d, is known, by focusing on the IR reflective tag 134, the depth, dz, of the IR reflective tag 134 below the surface 107 inside the cavity 118 can be determined by determining the distance in the Z direction that the IR objective lens 113 is moved from its starting position to focus on the IR reflective tag 134. By keeping the dose of the focused ion beam 132 that forms the IR reflective tag 134 low, subsequent gas-enhanced milling will remove all traces of the metal-silicide used to place the IR reflective tag 134 and will prevent the formation of leader holes that open to the active circuit 104 before the remainder of the gas-enhanced mill is complete.

FIG. 2A is a plan view illustrating a portion of the surface 107 of the bulk silicon 106 of FIG. 1C. As a result of the milling and backscattering of the focused ion beam 132 and the isotropic action of the etchant material 116, the cavity 118 forms with sloped sidewalls 202. In the example shown in FIG. 2A, the base, or floor, 210 of the cavity 118 is approximately 70 μm by 70 μm and is determining by the rastering pattern set during the gas-enhanced milling definition. Typical rastering dimensions are as small as 50 μm by 50 μm and as large as 150 μm by 150 μm, although rastering dimensions outside these nominal settings are usable. The IR reflective tag 134 is created on the base 210 of the cavity 118 as described above. In an embodiment, the IR reflective tag 134 is approximately 5 μm by 5 μm.

FIG. 2B is a graphical depiction 250 showing three instances of the IR reflective tag 134 of FIG. 2A as captured by the field of view of the IR camera 112. The center image 260 illustrates the IR reflective tag 134 in focus while the image 262 shows the IR reflective tag 134 out of focus by approximately −5 μm and the image 264 shows the tag IR reflective 134 out of focus by approximately +5 μm. In an embodiment using an objective lens 113 having a 100× magnification and a 0.8 NA, the IR reflective tag 134 is sharply focused in a ±2.5 μm depth of field. Therefore, because the IR camera 112 is able to focus on the IR reflective tag 134 within an error range of approximately ±2.5 μm, by knowing the location of the objective lens 113 in perpendicular relation to the surface 107, the perpendicular location of the IR reflective tag 134, and therefore, the depth, dz, of the base 210 of the cavity 118 can be accurately determined. In an embodiment where greater depth accuracy is desirable, a higher numerical lens may be used.

By knowing the parameters of the initial mill and the depth, dz, of the tag 134 placed after termination of the initial mill, a gas-enhanced milling rate can be determined. For example, if the initial gas-enhanced mill was applied for one hour, as described above, and resulted in a depth, dz, of 300 μm with an accuracy of ±2.5 μm, then a gas-enhanced milling rate of five (5) μm per minute was achieved. Therefore, knowing the remaining distance through the bulk silicon 106 to the active circuit 104, a subsequent etch can be programmed without fear of over etching the bulk silicon 106 and damaging the active circuit 104.

Figure 3A:
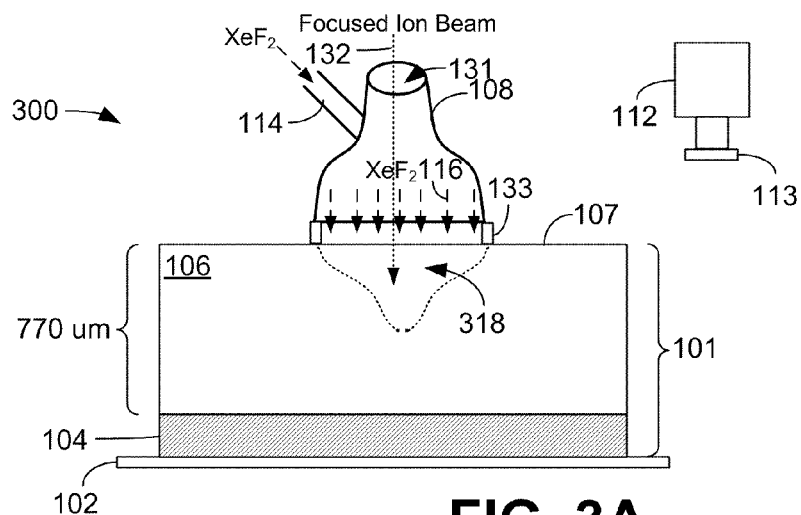
FIGS. 3A through 3C are schematic diagrams illustrating a portion of a system for backside circuit editing on full thickness silicon devices after a subsequent etch.

FIG. 3A is a schematic diagram illustrating a portion 300 of a system for backside circuit editing on full thickness silicon devices after a subsequent etch. As shown by FIG. 3A, all traces of the metal-silicide used to create the IR reflective tag 134 have been removed by a subsequent milling with XeF₂ and a focused ion beam 132 of gallium, resulting in the cavity 318.

In accordance with an embodiment of the system and method for backside circuit editing on full thickness silicon devices, and using the example above, the gas-enhanced milling process is applied to the bulk silicon 106 for a predetermined period of time, the duration of which is computed using the above-determined gas-enhanced milling rate, which in this example, is five (5) μm per minute. The gas-enhanced milling rate is not constant throughout the formation of the cavity. The milling rate decreases as a function of the depth of the cavity 318 because the seal 133 between the milling chamber 108 and the silicon substrate 106 opens as the etchant removes material from substrate 106, and because the area of exposed silicon in the cavity 318 increases so more of the etchant is consumed by etching the side walls of the cavity 118. In an embodiment with an initial gas-enhanced milling rate of 5 μm per minute, the final gas-enhanced milling rate falls to approximately 2 μm per minute when the base of the cavity 318 reaches the active circuitry 104. To maintain accurate knowledge of the depth of the cavity 318, repeated measurements of the depth and milling rate are employed, and the aforementioned parameters for controlling the milling rate (e.g., etchant flow rate, the ion beam current, the raster area of the ion beam, the focus of the ion beam, the step size and dwell time of the ion beam, and other factors, etc.) can be varied to optimize performance.

Figure 3B:
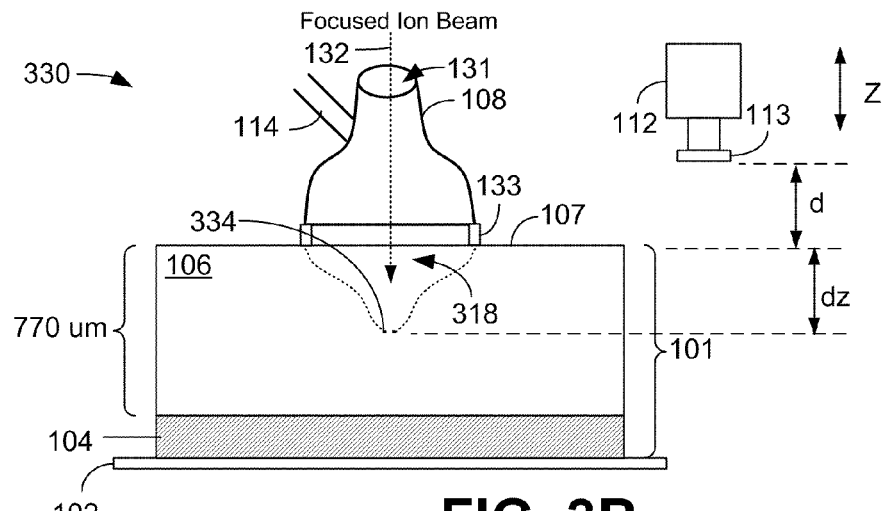

FIG. 3B is a schematic diagram illustrating a portion 330 of a system for backside circuit editing on full thickness silicon devices. As shown in FIG. 3B, the gas-enhanced milling process is terminated by terminating both the supply of etchant through the support structure 114 and the source of the ion beam. The milling chamber 108 moves upward to disengage the circuit device 101. Thereafter, a focused ion beam 132 of a material that is reflective of IR energy is supplied through opening 131 of the milling chamber 108 and is directed toward the bottom of the cavity 318, depositing another IR reflective tag 334. The IR reflective tag 334 is similar to the IR reflective tag 134, but is located at the base of the cavity 318, which is deeper than the cavity 118 (FIG. 1C).

Figure 3C:
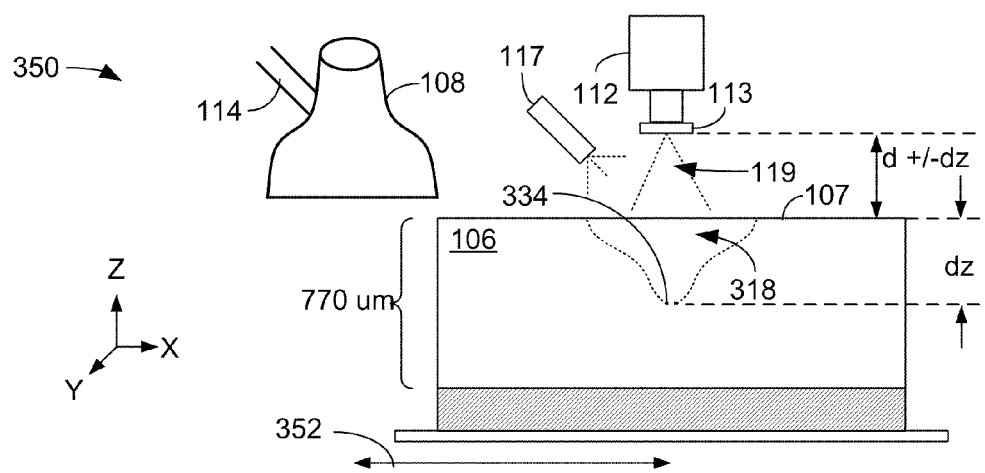

As shown in FIG. 3C, the circuit device 101 is moved in at least one of the X and Y directions by the movable surface 102, as shown using reference numeral 352, so that the objective lens 113 of the IR camera 112 is positioned directly above the bottom of the cavity 318 such that the IR reflective tag 334 falls within the field of view 119 of the IR objective lens 113. The IR reflective tag 334 reflects the infrared radiation provided by the external light source 117 back to the objective lens 113 of the IR camera 112 so that the objective lens 113 can focus on the IR reflective tag 334. Because the distance, d, is known, by focusing on the IR reflective tag 334, the depth, dz, of the tag 334 inside the cavity 318 and below the surface 107 can be determined, as described above.

Figure 4A:
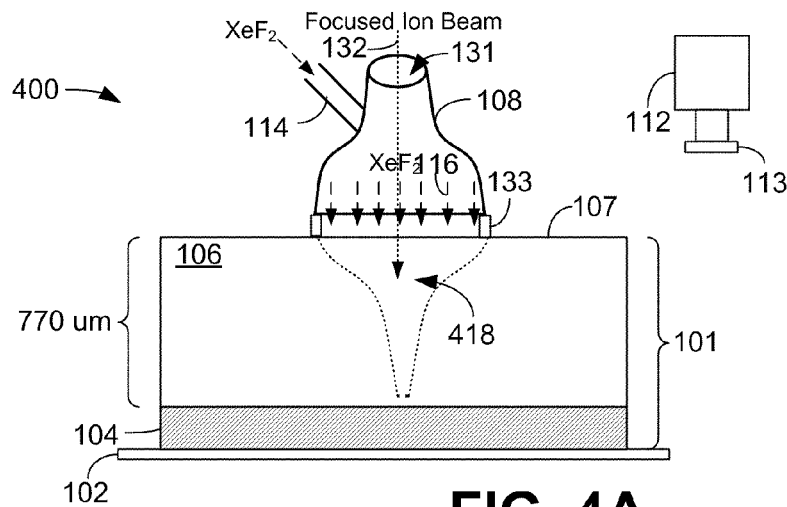
FIGS. 4A through 4C are schematic diagrams illustrating a portion of a system for backside circuit editing on full thickness silicon devices after another subsequent etch.

FIG. 4A is a schematic diagram illustrating a portion 400 of a system for backside circuit editing on full thickness silicon devices after another subsequent gas-enhance mill. As shown by FIG. 4A, all traces of the metal-silicide used to create the IR reflective tag 334 have been removed by a subsequent milling with $XeF_2$ and a focused ion beam 132 of gallium, resulting in the cavity 418.

In accordance with an embodiment of the system and method for backside circuit editing on full thickness silicon devices, and using the example above, the etchant and focused ion beam are applied to the bulk silicon 106 for a predetermined period of time, the duration of which is computed using the above-determined milling rate, which in this example, is five (5) μm per minute. The gas-enhanced milling rate is a function of the milling parameters, including the etchant flow rate, the ion beam current, the raster area of the ion beam, the focus of the ion beam, the step size and dwell time of the ion beam, and other factors, as mentioned above. These parameters may be adjusted to control the gas-enhanced milling rate to optimize cavity formation.

Figure 4B:
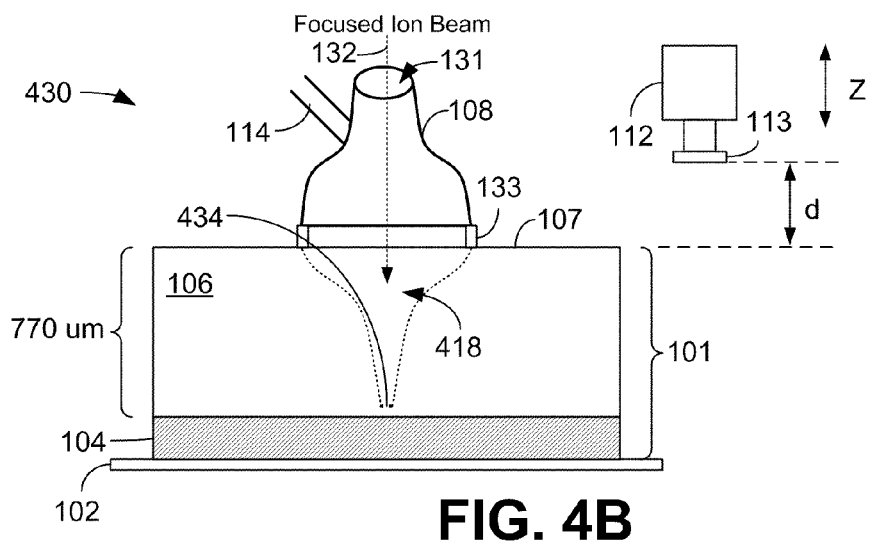

FIG. 4B is a schematic diagram illustrating a portion 430 of a system for backside circuit editing on full thickness silicon devices. As shown in FIG. 4B, the gas-enhanced milling process is terminated by terminating both the supply of etchant through the support structure 114 and the supply of the ion beam. The milling chamber 108 moves upward to disengage the circuit device 101. Thereafter, a focused ion beam 132 of a material that is reflective of IR energy is supplied through opening 131 of the etching chamber 108 and is directed toward the bottom of the cavity 418, depositing another IR reflective tag 434. The IR reflective tag 434 is similar to the IR reflective tag 134, but is located at the base of the cavity 418.

Figure 4C:
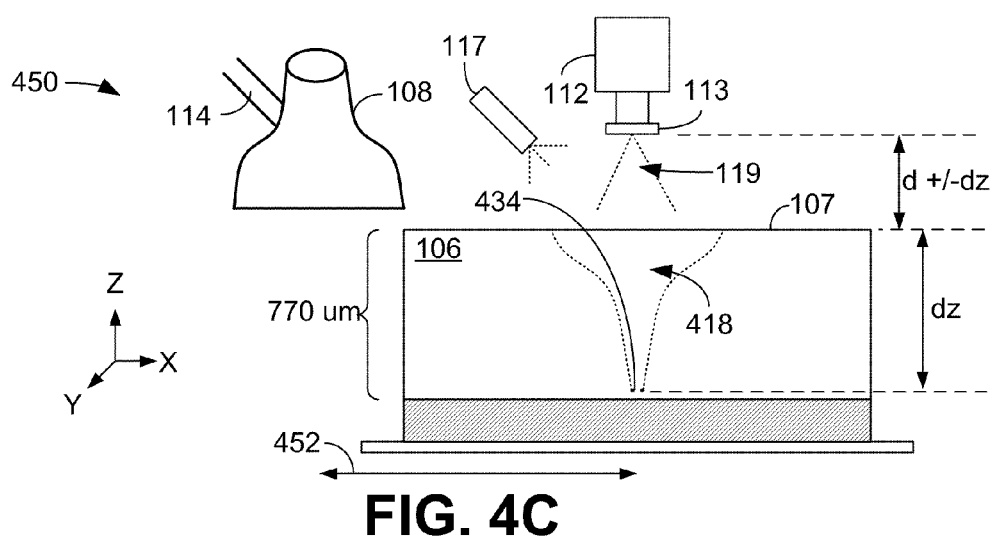

As shown in FIG. 4C, the circuit device 101 is moved in at least one of the X and Y directions by the movable surface 102, as shown using reference numeral 452, so that the objective lens 113 of the IR camera 112 is positioned directly above the bottom of the cavity 418 such that the IR reflective tag 434 falls within the field of view 119 of the objective lens 113. The IR reflective tag 434 reflects the infrared radiation provided by external light source 117 back to the IR camera 112 so that the objective lens of the IR camera 112 can focus on the IR reflective tag 434. Because the distance, d, is known, by focusing on the IR reflective tag 434, the depth, dz, of the IR reflective tag 434 inside the cavity 418 and below the surface 107 can be determined, as described above.

The above-described procedure can be repeated until the distance between the bottom of the cavity 418 and the active circuit 104 is sufficiently small that the IR reflection from the metal layers (not shown) of the active circuit 104 to be edited obscures the IR reflection from the IR reflective tag 434 at the base of the cavity 418. Interference between the reflective surface of the IR reflective tag 434 on the bottom of the cavity 418 and the layers of metal (not shown) in the active circuit 104 occurs when approximately 25-30 μm of bulk silicon 106 remains over the part of the active circuit 104 where the editing is to be performed. At this point, the access hole needed to edit the circuit is formed, the tagging procedure to measure the depth of the cavity ceases to be needed or effective, and traditional circuit editing techniques for exposing circuitry developed on thinned parts are performed.

Figure 5:
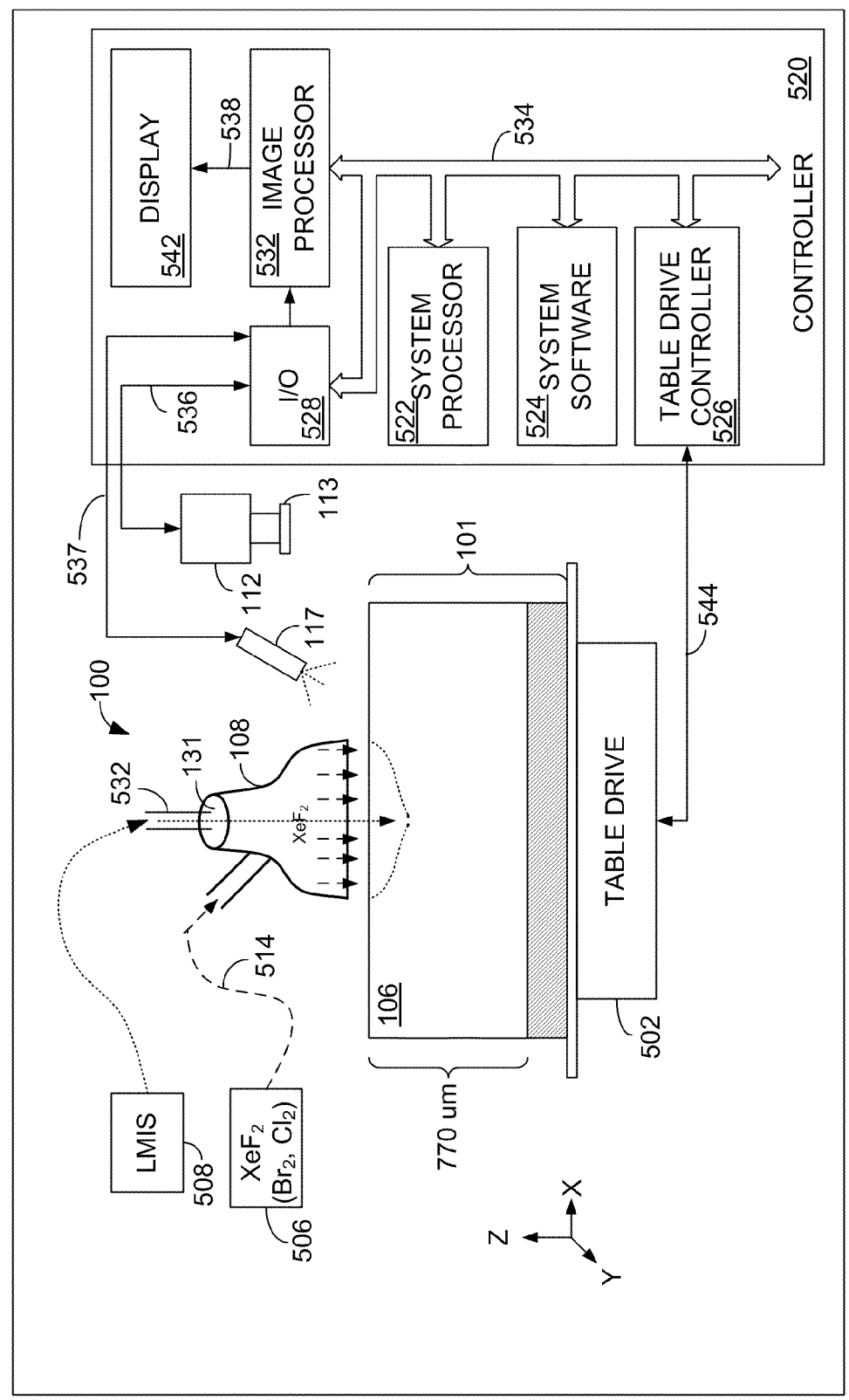
FIG. 5 is a block diagram illustrating an embodiment of a system for backside circuit editing on full thickness silicon devices.

FIG. 5 is a block diagram illustrating an embodiment of a system for backside circuit editing on full thickness silicon devices. The system 500 includes the system portion 100 adapted to receive etchant material from a gas cabinet 506. In an embodiment, the etchant can be $XeF_2$, $Br_2$, $Cl_2$, or another etchant. The system 500 also includes a liquid metal ion source (LMIS) 508, which includes a source of IR reflective material. In an embodiment, the IR reflective material is gallium. The etchant is provided over fluid connection 514 to the milling chamber 108 and the IR reflective material is provided through a column of electron optics 532 suitable to shape the gallium beam into a finely focused (<0.2 μm diameter) beam, as described above. The focused ion beam is provided through the opening 131 of the milling chamber 108, as described above.

As shown in FIG. 5, the system portion 100 is located on a table drive element 502. The table drive element 502 is controlled by a controller 520 and allows controllable movement in a horizontal plane defined by the X and Y directions.

The controller 520 includes a system processor 522, system software 524, a table drive controller 526, an input/output (I/O) element 528, and an image processor 532, coupled together over a system bus 534. The system bus can be any communication bus that allows bi-directional communication between and among the connected elements. The controller 520 also includes a display 542.

The system processor 522 can be any general-purpose or special-purpose processor or microprocessor that is used to control the operation of the system 500. The software 524 can contain executable instructions in the form of application software, execution software, embedded software, or any other software that controls the operation of the controller 520 and the elements in the system 500.

The table drive controller 526 is operatively coupled to the table drive element 502 over connection 544. In accordance with an embodiment of the system for backside circuit editing on full thickness silicon devices, the table drive controller 526 is used to control the table drive element 502 so that the circuit device 101 can be moved in a plane, defined in the X and Y directions, from a position proximate to the etching chamber 108 to a position proximate to the IR camera 112 as described above.

The IR camera 112 and external light source 117 are connected to the I/O element 528 over connections 536 and 537, respectively. The objective lens 113 of the IR camera 112 can move in an axis that is perpendicular to the surface 107 of the bulk silicon 106. This axis is referred to as the "Z" axis and allows the IR camera 112 and/or the IR objective lens 113 to move in a direction that is toward and away from the surface 107. In an embodiment, the surface 107 is parallel to the plane formed by the movable surface 102 in the X and Y directions. The I/O element 528 can include the physical and electronic interface used to couple the IR camera 112 and the light source 117 to the controller 520. When the IR camera 112 is used to focus on a tag as described above, the image processor 532 receives the image from the I/O element 528 and provides the image information to the system processor 522 and also provides the image for viewing over the display 542 over connection 538. In this manner, an operator of the system 500 can observe the display 524 to determine when the image of the IR reflective tag is in focus, as described in FIG. 2B.

Figure 6A:
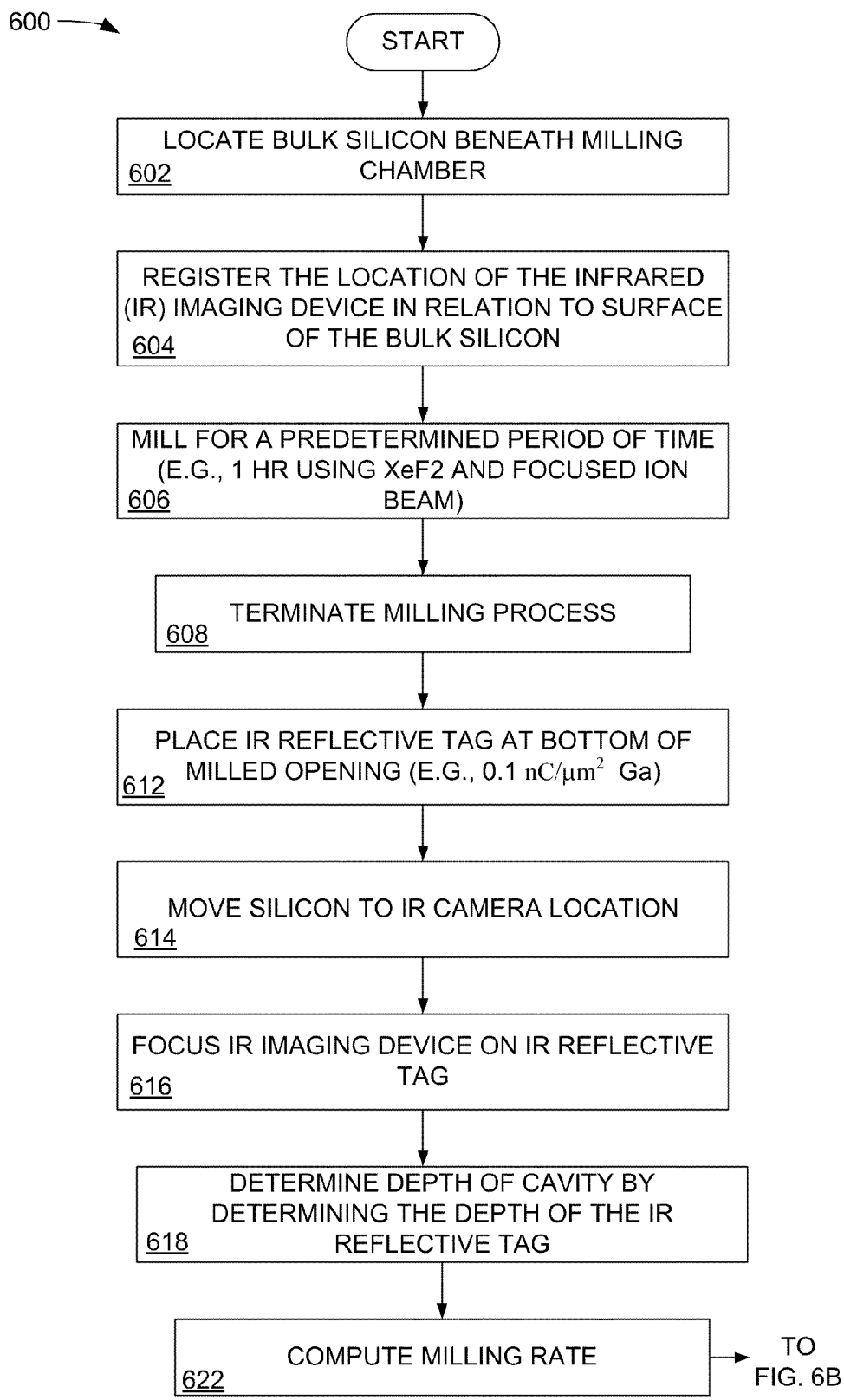
FIGS. 6A and 6B are a flowchart collectively illustrating the operation of an embodiment of a method for backside circuit editing on full thickness silicon devices.
Figure 6B:
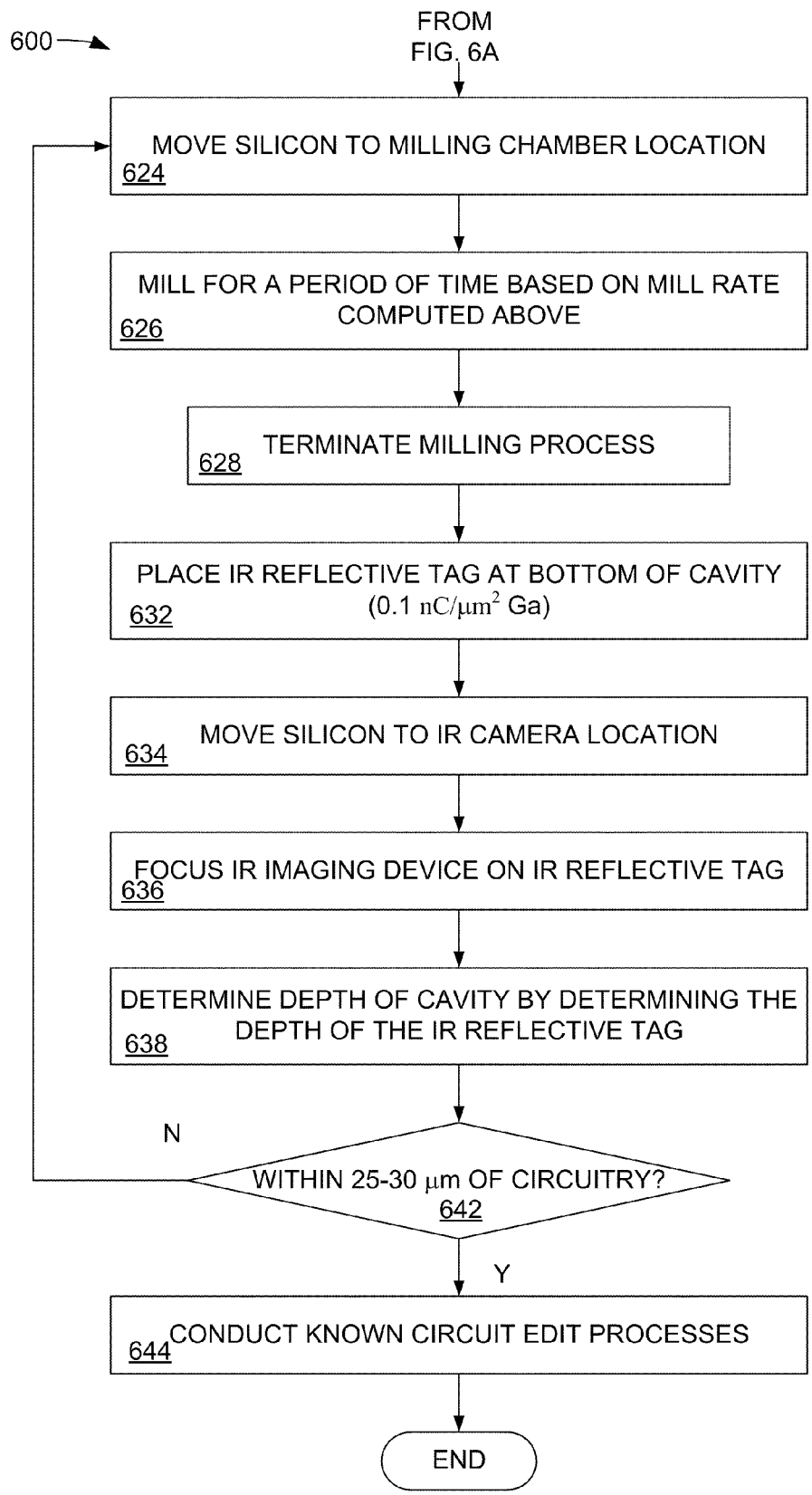

FIGS. 6A and 6B are a flowchart 600 collectively illustrating the operation of an embodiment of a method for backside circuit editing on full thickness silicon devices. The blocks in the flow chart 600 can be performed in or out of the order shown. In addition, at least some of the steps can be performed in parallel. In block 602 the bulk silicon is located beneath the milling chamber 108. In an embodiment, the milling chamber is located above an area in which the active circuit 104 is desired to be accessed.

In block 604, the location of the objective lens 113 of the IR camera 112 in relation to the surface 107 of the silicon is registered so that the perpendicular distance, d, (FIG. 1B), between the surface 107 and the objective lens 113 of the IR camera 112, can be established. In block 606 a gas-enhanced mill is initiated to include a focused ion beam and an etchant introduced to the surface 107 of the bulk silicon 106 for a predetermined period of time. In an embodiment, the ion beam can be a 4.4 nA Ga beam and the etchant can be $XeF_2$, and can be applied for one hour. In block 608, the gas-enhanced milling process is terminated.

In block 612, an IR reflective tag 134 is placed at the bottom of the milled cavity 118 (FIG. 1B). For example, a low dose of gallium can be used to form the IR reflective tag 134 at the base 210 of the cavity 118 (FIG. 2A).

In block 614, the table drive element 502, under the control of the table drive controller 526 moves the bulk silicon 106 so that the base 210 of the cavity 118 is within the field of view 119 of the IR camera 112. In block 616, the IR camera 112 is focused on the IR reflective tag 134, as described in FIG. 2B. In block 618, the depth of the cavity 118 is determined by determining the depth, dz, of the tag 134 relative to the surface 107. For example, the distance, dz, can be determined by determining the distance that the objective lens 113 of the IR camera 112 is moved from its original location in the z axis above the surface 107 to bring the IR reflective tag 134 into focus, as described above in FIG. 2B.

In block 622, knowing the etch parameters, the initial position, d, of the objective lens 113 of the IR camera 112 and the position, dz, of the IR reflective tag 134, the etch rate is computed. In block 624, the table drive element 502 under the control of the table drive controller 526, moves the bulk silicon 106 back to its initial position relative to the etching chamber 108.

In block 626, the gas-enhanced milling process is again initiated through the milling chamber 108, and therefore to the surface 107 of the bulk silicon 106, for a period of time based on the milling rate computed in block 622. In block 628, the gas-enhanced milling process is terminated. In block 632, another IR reflective tag 334 is placed at the bottom of the cavity 318. In block 634, the table drive element 502, under the control of the table drive controller 526, moves the bulk silicon 106 so that the IR reflective tag 334 is within the field of view of the objective lens 113 of the IR camera 112. In block 636, the objective lens 113 of the IR camera 112 is focused on the IR reflective tag 334.

In block 638, the depth of the cavity 318 is determined by determining the distance, dz, of the IR reflective tag 334 relative to the surface 107, as described above. In block 642 it is determined whether the gas-enhanced milling process is accomplished to within approximately 25 to 30 µm of the active circuit 104. If it is determined in block 642 that the depth of the cavity 318 is not within 25 to 30 µm of the active circuit 104, the process returns to block 624 and the etch is repeated.

If it is determined in block 642 that the milling process has created a cavity with a bottom that is within 25 to 30 µm of the active circuit 104, then, in block 644, the tagging process is terminated and exposure of the circuit is resumed with traditional circuit editing techniques developed on thinned parts.

This disclosure describes the invention in detail using illustrative embodiments. However, it is to be understood that the invention defined by the appended claims is not limited to the precise embodiments described.

What is claimed is:

1. A system for accessing circuitry on a silicon device, comprising:
   a flip chip circuit device comprising active circuitry and full-thickness bulk silicon;
   a moveable surface for supporting and locating the circuit device in a plane;
   an infrared (IR) imaging device located at a defined perpendicular distance from a surface of the bulk silicon, the surface of the bulk silicon parallel to the plane;
   a milling chamber configured to direct an etchant and a focused ion beam to the surface of the bulk silicon, the etchant and the focused ion beam capable of creating a milled cavity in the bulk silicon;
   an IR reflective material located at a base of the cavity; and
   wherein the circuit device is located within a field of view of the IR imaging device such that the IR reflective material is brought into focus by moving the IR imaging device an adjustable distance perpendicular to the surface of the bulk silicon, and where the adjustable perpendicular distance is indicative of a depth of the cavity.

2. The system of claim 1, wherein the IR reflective material is gallium.

3. The system of claim 1, wherein the IR reflective material is gallium applied using a focused ion beam.

4. The system of claim 1, wherein the IR reflective material is gallium applied using a focused ion beam and creates a pattern at the base of cavity, the pattern approximately 5 micrometers (µm) by 5 µm.

5. The system of claim 1, wherein the IR imaging device focuses on the IR reflective material within a range of approximately ±2.5 micrometers (µm).

6. A method for accessing circuitry on a full thickness, flip-chip silicon device, the method comprising:
   locating a circuit device comprising active circuitry and bulk silicon proximate to a gas-enhanced milling source;
   locating an infrared (IR) imaging device at a defined perpendicular distance from a surface of the bulk silicon;
   gas-enhanced milling the surface of the bulk silicon for a predetermined duration to create a cavity in the bulk silicon;
   creating an IR reflective material at a base of the cavity;
   locating the circuit device within a field of view of the IR imaging device;
   focusing the IR imaging device on the IR reflective material by moving the IR imaging device an adjustable distance perpendicular to the surface of the bulk silicon; and
   determining a depth of the cavity by measuring the adjustable perpendicular distance.

7. The method of claim 6, further comprising computing a gas-enhanced milling rate by dividing the adjustable perpendicular distance by the predetermined duration.

8. The method of claim 6, wherein the creating an IR reflective material comprises applying gallium.

9. The method of claim 6, wherein the creating an IR reflective material comprises applying gallium using a focused ion beam.

10. The method of claim 6, wherein the creating an IR reflective material comprises applying gallium using a focused ion beam to form a pattern at the base of cavity, the pattern approximately 5 micrometers (µm) by 5 µm.

11. The method of claim 6, wherein the focusing the IR imaging device on the IR reflective material comprises focusing within a range of approximately ±2.5 micrometers (µm).

12. A method for determining gas-enhanced milling depth in silicon, the method comprising:

locating bulk silicon proximate to a gas-enhanced milling source;
locating an infrared (IR) imaging device at a defined perpendicular distance from a surface of the bulk silicon;
gas-enhanced milling the surface of the bulk silicon for a predetermined duration to create a cavity in the bulk silicon;
creating an IR reflective material at a base of the cavity;
locating the cavity within a field of view of the IR imaging device;
focusing the IR imaging device on the IR reflective material by moving the IR imaging device an adjustable distance perpendicular to the surface of the bulk silicon; and
determining a depth of the cavity by measuring the adjustable perpendicular distance.

13. The method of claim 12, further comprising computing a gas-enhanced milling rate by dividing the adjustable perpendicular distance by the predetermined duration.

14. The method of claim 12, wherein the creating an IR reflective material comprises applying gallium.

15. The method of claim 12, wherein the creating an IR reflective material comprises applying gallium using a focused ion beam.

16. The method of claim 12, wherein the creating an IR reflective material comprises applying gallium using a focused ion beam to form a pattern at the base of cavity, the pattern approximately 5 micrometers ($\mu$m) by 5 $\mu$m.

17. The method of claim 12, wherein the focusing the IR imaging device on the IR reflective material comprises focusing within a range of approximately ±2.5 micrometers ($\mu$m).

* * * * *